United States Patent [19]
Wei et al.

[11] Patent Number: 5,517,031
[45] Date of Patent: May 14, 1996

[54] SOLID STATE IMAGER WITH OPAQUE LAYER

[75] Inventors: Ching-Yeu Wei; Robert F. Kwasnick; Siegfried Aftergut, all of Schenectady; Brian W. Giambattista, Scotia, all of N.Y.

[73] Assignee: General Electric Company, Schenectady, N.Y.

[21] Appl. No.: 264,097

[22] Filed: Jun. 21, 1994

[51] Int. Cl.$^6$ ................................................ G01T 1/24
[52] U.S. Cl. .................. 250/370.08; 250/370.09; 250/370.11
[58] Field of Search ................ 250/370.11, 370.09, 250/370.08

[56] References Cited

U.S. PATENT DOCUMENTS

| | | | |
|---|---|---|---|
| 4,952,796 | 8/1990 | Fruhauf et al. | 250/214 R |
| 5,079,426 | 7/1992 | Antonuk et al. | 250/370.09 |
| 5,179,284 | 1/1993 | Kingsley et al. | 250/370.11 |
| 5,233,181 | 8/1993 | Kwasnick et al. | 250/208.1 |
| 5,401,668 | 3/1995 | Kwasnick et al. | 437/3 |

*Primary Examiner*—Constantine Hannaher
*Attorney, Agent, or Firm*—Donald S. Ingraham; Marvin Snyder

[57] ABSTRACT

A solid state radiation imager includes a photosensor array having a plurality of pixels disposed on a substrate, each pixel having a respective photosensor coupled to a thin film transistor (TFT). The photosensor array further includes an opaque passivation layer that is disposed over non-photodiode areas of the photosensor array, including the TFT and address lines in the array. The opaque passivation layer has an absorbance that is greater than 1, and typically that is greater than 2. The opaque passivation layer further is typically made of a thermally stable polymer mixed with a light absorbing material such as an organic dye (e.g., Sudan Black B), carbon black, or graphite.

14 Claims, 2 Drawing Sheets

SOLID STATE IMAGER WITH OPAQUE LAYER

This application is related to the application entitled "CT Array with Improved Photosensor Linearity and Reduced Cross-Talk", Ser. No. 08/264,098, now U.S. Pat. No. 5,430,298 filed concurrently herewith, which is assigned to the assignee of the present invention and incorporated herein by reference.

BACKGROUND OF THE INVENTION

Solid state radiation imaging arrays typically comprise arrays of photosensor devices coupled to a scintillator in which the incident radiation to be detected by the imager (such as x-rays) is absorbed. Light photons generated in the scintillator as a result of the absorption of incident radiation pass to the photodetector array and are in turn absorbed by the photosensor, resulting in the accumulation of charge on the photosensor that corresponds to the flux of light photons; reading the charge accumulated on respective photosensors provides a measure of the intensity of the incident radiation and the relative position on the array at which the radiation was absorbed.

In one type of high resolution photosensor array photodiodes are arranged in a two-dimensional pixel array. The respective photosensors are formed on a substrate; each photodiode comprises a body (or island) that, for example, consists of a layer of n type silicon disposed over the contact pad (or, bottom electrode); a thicker layer of intrinsic amorphous silicon that is disposed over n type silicon; and, a layer of p+ type silicon disposed over the planar top portion of the intrinsic silicon body to form a common electrode contact (alternatively, a photodiode can be fabricated with the doping types reversed from that described above). A common electrode is coupled to the photodiode via the p+ type silicon layer. A bias voltage applied across the photodiode results in the formation of an increased depletion region in the semiconductive material. Charge generated in the photodiode as a result of the absorption of light photons from the scintillator reduces the bias across the diode contacts, and the collected charge is read when a switching device in the array, such as a thin film transistor (TFT), couples the photodiode to readout electronics via an address line.

Optimal spatial resolution and contrast in the signal generated by the photosensor array is achieved when incident optical photons from the scintillator are absorbed substantially only in the photodiode directly in line with the region of the scintillator in which the optical photons were generated. Optical photons incident on the photosensor array in areas other than the photodiode, such as the TFT switching devices coupled to each photodiode or the address lines, can result in scattering or absorption of the photons that causes noise in the array.

The photodiode passivation and optical coupling layers (between the photodiode and the scintillator) typically comprise a light transmissive material such as polyimide. This passivation layer is disposed over the array, including the TFTs, the photodiodes, and the address lines. Optical photons passing from the scintillator can be scattered and pass through the transparent passivation layer into the photosensor array outside of the photodiode in the array region underlying the portion of the scintillator in which the optical photons were generated. Such scattering and absorption presents problems of increased cross-talk and noise in the array. Cross-talk reduces the spatial resolution of the array, and absorption of optical photons in TFT switching devices can result in spurious signals being passed to the readout electronics.

It is thus an object of this invention to provide a photosensor array in which non-photodiode areas of the array, e.g., the TFTs and address lines, are shielded from incident optical photons.

SUMMARY OF THE INVENTION

In accordance with this invention, a solid state radiation imager comprises a photosensor array having a plurality of pixels disposed on a substrate, each pixel having a respective photosensor coupled to a thin film transistor (TFT). The photosensor includes a photosensitive island typically comprising a layer of amorphous silicon (a—Si). The photosensor array further comprises an opaque passivation layer that is disposed over the TFT and portions of the photosensor in each of the pixels. The opaque passivation layer has an absorbance that has a value that is greater than 1, and typically a value greater than 2. The opaque passivation layer typically comprises an epoxy, a polyimide, or other thermally stable polymer mixed with a light absorbing material such as an organic dye (e.g., Sudan Black B), carbon black, graphite, or the like. The opaque passivation layer is also thermally stable (that is, the absorbance of the material does not decrease to less than 1 after exposure to temperatures up to about 250° C. for up to about six hours).

The opaque passivation layer is disposed over the TFT in each pixel and over portions of the photodiode, such as the sidewalls of the photosensitive island, up to the upper planar surface of the photodiode, through which the incident optical photons pass into the photodiode. Alternatively, the photosensor array further comprises an underlying optically transmissive dielectric layer that extends over the sidewalls of the photosensitive island and the opaque passivation layer is disposed around the photosensitive island.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
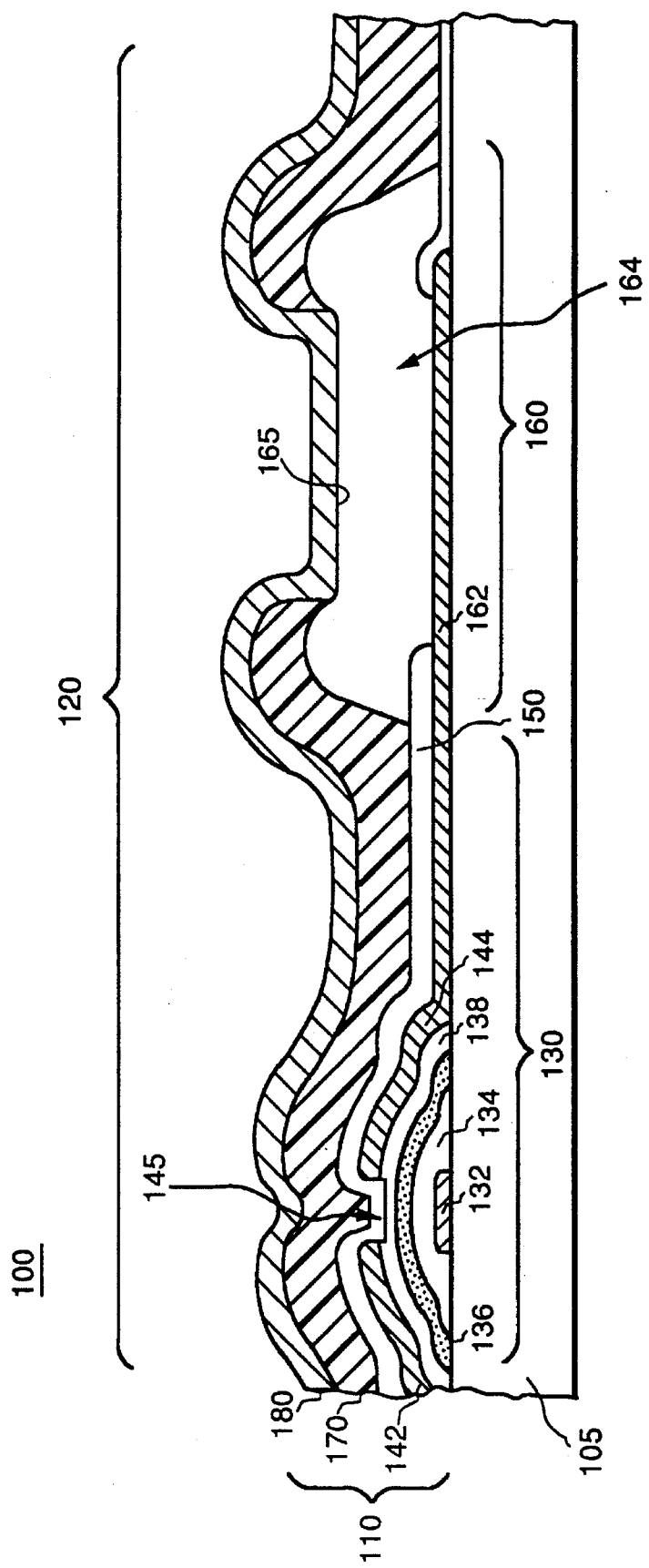
FIG. 1 is a cross-sectional view of a portion of a photosensor array in accordance with one embodiment of this invention.

A solid state radiation imager 100 comprises a photosensor array 110 having a number of pixels 120, a representative one of which is illustrated in FIG. 1. Each pixel comprises a switching device 130, such as a thin film transistor as shown in FIG. 1, that is electrically coupled to a photosensor 160. In accordance with this invention, photosensor array 110 comprises an opaque passivation layer 170 that is disposed over portions of photosensor array 120, including over TFT 130 and up to the sidewalls of photosensor 160.

Each pixel 120 is typically positioned in array 110 to be exposed to optical photons passing from a scintillator (not shown) that is optically coupled to the photosensor array. In a common arrangement, photosensor 160 is one of a number of photosensors arranged in a pattern of rows and columns in array 110, with each photosensor being coupled through its respective TFT to readout electronics via a data line (not shown). For ease of describing the invention, only one pixel is illustrated, and other elements that may be formed in photosensor array, such as address lines (commonly in a matrix arrangement of scan and data lines) which are coupled to TFT 130 are not shown.

TFT 130 is disposed on a substrate 105 and comprises a gate electrode 132 comprising a conductive material such as aluminum, chromium, molybdenum, or the like. A gate dielectric layer 134 is disposed over gate electrode 132 and typically comprises an inorganic dielectric material such as silicon nitride, silicon oxide, or the like. A semiconductor layer 136 comprising intrinsic hydrogenated amorphous silicon (referred to herein as amorphous silicon or a—Si) or the like is disposed over gate dielectric layer 134, and a doped semiconductor layer 138, comprising n+ doped a—Si (e.g., doped with an n-type dopant such that the material has a conductivity greater than about $10^{-3}$ $(\Omega\text{-cm})^{-1}$); these layers over the gate electrode are patterned to form the body of TFT 130 (e.g., as illustrated in FIG. 1). TFT 130 further comprises a drain electrode 142 and a source electrode 144 (comprising a conductive material such as chromium, molybdenum, or the like) disposed over the body of the TFT and separated by a channel region 145. The channel region is formed by removal of n+ silicon layer 138 in the region between source electrode 144 and drain electrode 142. A TFT passivation layer 150 typically comprising an inorganic dielectric material such as silicon oxide or the like is disposed over TFT 130. TFT passivation layer 150 typically has a thickness in the range between about 0.1 μm and 1 μm.

Photosensor 160 is disposed on substrate 105 and is electrically coupled to TFT 130 via source electrode 144. Photosensor 160 typically is a photodiode as illustrated in FIG. 1 and comprises a bottom electrode 162 that is typically disposed on substrate 105 and is formed of the same electrically conductive material that comprises source electrode 144 (for ease of description, "lower" and "bottom" are used interchangeably and "upper" and "top" are used interchangeably to refer to portions of the photodiode with respect to their proximity to the substrate as illustrated in the Figures; no operational or functional limitation on the orientation of the device is implied). A photosensor island 164 is disposed in electrical contact with bottom contact pad 162; photosensor island 164 is typically mesa-shaped, having sidewalls sloping upwardly and inwardly from substrate 105 towards an upper surface 165. Photosensor island 120 typically comprises a—Si or combinations of a—Si and other materials, for example a—Si carbide or a—Si germanium (respectively, a—$Si_xC_{1-x}$ or a—$Si_xGe_{1-x}$, where $0<x\leq 1$). Photosensor island 164 typically further has relatively thin bands of a n-type doped region (not shown) and p-type doped region (not shown) at the bottom and top, respectively, of the island structure to enhance electrical contact with the adjoining electrode and to form the p-i-n diode structure. The thickness of the photosensor island is typically between about 0.1 micron and 10 microns, although in some arrangements the thickness may be greater than 10 microns. Amorphous silicon and related materials are typically deposited by plasma enhanced chemical vapor deposition (PECVD) or similar methods and then patterned, for example by etching, to form the desired island structure.

In accordance with this invention, opaque passivation layer 170 is disposed over photosensor array 110 so as to overlie (cover) the non-photodiode regions of the array, that is TFT 130, address lines, and other portions of the array extending up to photosensor island 164. In the embodiment illustrated in FIG. 1, opaque passivation layer 170 extends over the sidewalls of photosensor island 164 and up to top surface 165 of the photosensor. In this arrangement, the light absorbing material of opaque layer 170 is disposed over substantially all of photosensor array 110 except portions of top surface 165 of the photodiode. For example, typically opaque passivation layer 170 does not extend beyond about 4 μm from the edges of top surface 165.

Opaque layer 170 comprises a light absorptive material and has an absorbance value greater than 1, and typically greater than 2. Absorbance, as used herein, is a measure of the light absorption characteristics of the material, and is determined by the negative log (base 10) of the transmittance (transmittance being the fraction of light getting through a sample). The light absorptive material typically comprises a polymer in which a light absorbing substance has been mixed to provide the desired absorbance value. The light absorbing substance typically comprises an organic dye such as Sudan Black B or, alternatively, a substance such as carbon black, graphite, or the like. Any polymer compatible with photosensor array 110 can be used, and illustrative examples include polyamides, polyimides, polycarbonates, polyesters, polyphenylene ethers, acrylics, and blends prepared therefrom. Opaque passivation layer 170 further is thermally stable, that is, the absorbance of the layer does not become less than 1 when heated for about six hours up to a temperature of about 250° C. Further, under the heating conditions noted above the polymer structure does not undergo chemical decomposition that would cause cracks or lifting of the layer resulting in the layer losing its dielectric properties or breaking the structural integrity of the layer (thereby exposing such underlying components in the array to materials used in other processing steps in the fabrication of the array).

In one example of the present invention, opaque layer 170 is formed by dissolving a black dye in a pre-imidized polyimide such as Ciba-Geigy brand Probimide 286, which is then spun onto photosensor array 110 to a thickness between about 0.5 μm and 3 μm. A polyimide layer comprising a 50% by weight Sudan Black B dye having a thickness of about 2 μm has an absorbance value of about 2.5 in the wavelength range of between 300 nm and 600 nm. After being spun on the array, the polyimide/dye material is heated to remove solvents; although some bleaching occurs in heating at temperatures of about 200° C. (after about 5 hours, the mixture of polyimide and Sudan Black B dye described above has an absorbance of about 2.0 in the 300 nm–600 nm range), the opaque passivation layer remains sufficiently light absorbant to produce the desirable operating characteristics in the imager.

Alternatively, other light absorbing substances can be introduced into a polyimide to form opaque layer 170. For example, carbon black, graphite, or the like can be mixed with the polymer to produce a material having the desired absorbance. The mixture of the polymer and these light absorbing substances is also thermally stable (that is, the absorbance does not drop below 1 after heating for six hours at temperatures up to about 250° C.); for example, polyimide containing about 25% carbon black by weight has shown no degradation of absorbance values after annealing cycles at 250° C. for 16 hours.

Figure 2:
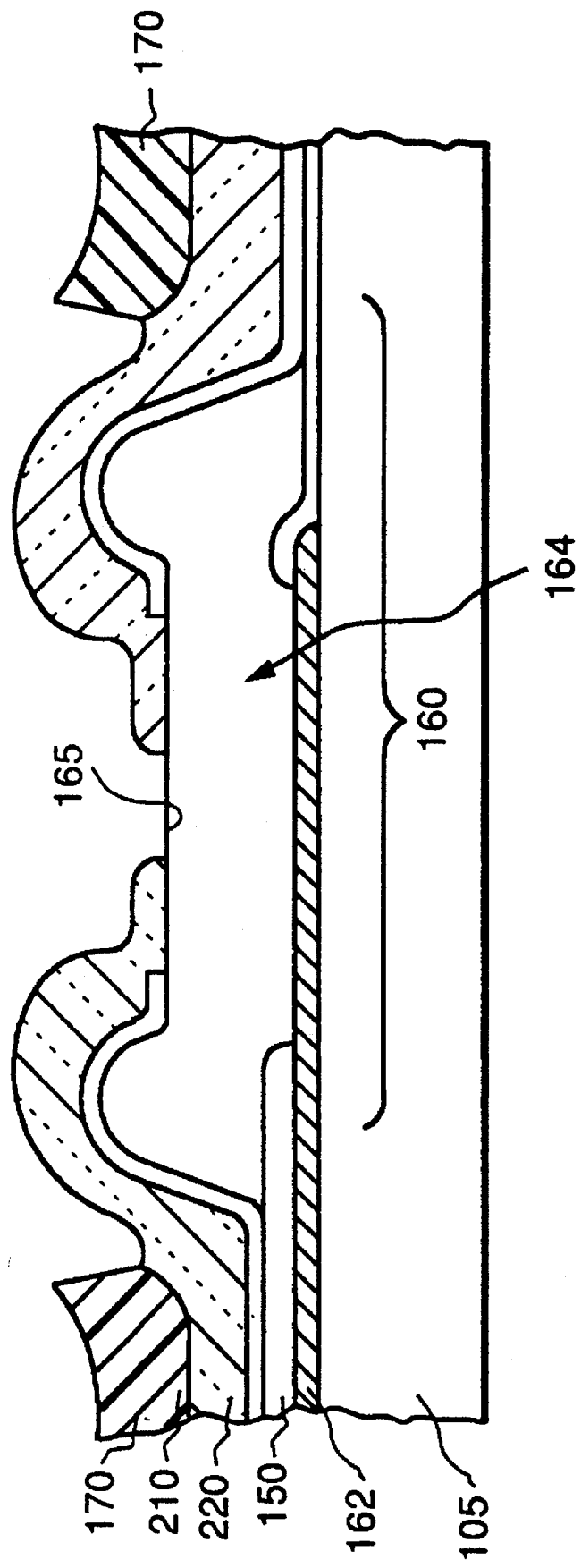
FIG. 2 is a cross-sectional view of a portion of a photosensor array in accordance with another embodiment of this invention.

In an alternative embodiment of this invention, opaque passivation layer 170 is disposed over a substantially transparent (e.g., having a light transmittance of about 90% or more) dielectric layer 210 (FIG. 2) and a moisture barrier 220. Transparent dielectric layer typically comprises an organic dielectric, e.g., polyimide, that is deposited, for example by spin coating, to a thickness of between about 0.5 micron and 2.5 microns. Moisture barrier layer 220 typically comprises inorganic dielectric material, such as silicon nitride, that is disposed over the sidewalls and portions of the top surface of photosensor island 164. Details pertaining to formation of moisture barrier layer 220 and transparent dielectric layer 210 are provided in U.S. Pat. No. 5,233,181, entitled "Photosensitive Element With Two Layer Passivation Coating", which is assigned to the assignee of the present invention and incorporated herein by reference. In this arrangement, opaque passivation layer is patterned (e.g., by photolithographic processes) so that it abuts photosensor island 164 but does not extend over the sidewalls of the island. This structure thus also provides needed passivation of the sidewalls of the photodiode while keeping the light absorbing material of opaque layer 170 away from the photosensitive areas of photodiode 160.

A common electrode 180 (shown in FIG. 1; not illustrated in FIG. 2) is deposited over opaque layer 170 and photosensor 160 so as to be in electrical contact with top surface 165 of each photodiode. Common electrode 180 typically comprises a light transmissive conductive material such as indium tin oxide or the like. A scintillator (not shown) is disposed over photosensor array 110 and comprises a scintillating material selected to have a high absorption cross section for radiation of the type it is desired to detect with imager 100; for example, in imagers designed for detection of x-rays, the scintillator material is typically cesium iodide doped with thallium, or, alternatively, sodium (CsI:Tl; CsI:Na).

In operation, radiation incident on imager array 100 is absorbed in the scintillator material (not shown) with the resultant generation of optical photons. The optical photons pass towards photosensor array 110. Substantially all (e.g., in accordance with the selected absorbance of the layer) optical photons incident on opaque passivation layer 170 are absorbed; substantially all of the optical photons that enter photodiode 160 (which is typically reverse biased, forming a depletion region throughout the diode intrinsic silicon layer, with at most only a small region of the n and p layers) are absorbed and result in the generation of charge in the diode which is collected at bottom contact 162 (the efficiency of the photosensor in absorbing incident photons is expressed by its quantum efficiency; the quantum efficiency of the imagers discussed herein is typically in the range between 50% and 90%). The presence of opaque passivation layer 170 over the photosensor array TFTs, address lines, and other non-photodiode regions serves to reduce the scattering of optical photons away from respective photodiodes and also serves to substantially prevent the absorption of optical photons in the TFTs. This reduction in scattering and in noise improves the modulation transfer function (MTF) of the imager, which is defined as the response of the imager to an input at a given spatial frequency relative to a zero spatial frequency. The contrast of the array is improved as a result of the reduced scattering because scattered light raises the background signal in the array.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A solid state radiation imager comprising:

a photosensor array disposed on a substrate, said photosensor array comprising a plurality of photosensors and thin film transistors (TFTs), each of said photosensors comprising a respective photosensitive island disposed over said substrate and electrically coupled to a respective one of said TFTs, respective ones of said photosensors and TFTs coupled together comprising respective pixels in said array, said array further comprising an optically transmissive common electrode disposed, said TFTs and said photosensor islands being disposed between said common electrode and said substrate;

said photosensor array further comprising an opaque passivation layer disposed around said photosensor islands so as to cover non-photosensor island areas in each of said pixels and to overlie at least said TFTs, said common electrode being disposed over said opaque passivation layer;

said opaque passivation layer comprising a thermally stable polymer mixed with a light absorbing material.

2. The imager of claim 1 wherein said opaque passivation layer has an absorbance value greater than 1.

3. The imager of claim 2 wherein said opaque passivation layer has an absorbance value not less than 2.

4. The imager of claim 2 wherein the thickness of said opaque passivation layer is in the range between about 0.5 μm and 3 μm.

5. The imager of claim 1 wherein said thermally stable polymer comprises a polymer selected from the group consisting of polyamides, polyimides, polycarbonates, polyesters, polyphenylene ethers, acrylics, and blends prepared therefrom.

6. The imager of claim 1 wherein said light absorbing material is selected from the group consisting of organic dyes, carbon black, and graphite.

7. The imager of claim 1 wherein said opaque passivation layer is further disposed over the sidewalls of each of said photosensor islands.

8. The imager of claim 1 wherein said opaque passivation layer is disposed over said array such that it abuts the respective sidewalls of said photosensor islands.

9. The imager of claim 8 further comprising an optically transmissive dielectric layer disposed between said opaque passivation layer and said photosensor array.

10. The imager of claim 9 wherein said optically transmissive dielectric layer comprises polyimide.

11. The imager of claim 1 further comprising an inorganic dielectric layer disposed over each of said photosensor islands.

12. The imager of claim 11 wherein said inorganic dielectric layer comprises a material selected from the group consisting of silicon nitride and silicon oxide.

13. The imager of claim 1 wherein said photosensor and said TFT each comprises amorphous silicon.

14. The imager of claim 1 wherein said opaque passivation layer comprises a material that is thermally stable at temperatures less than about 250° C. at times less than about 6 hours.

\* \* \* \* \*